United States Patent
Mezouari

(10) Patent No.: US 12,532,586 B2
(45) Date of Patent: Jan. 20, 2026

(54) MICRO-LED DEVICE

(71) Applicant: PLESSEY SEMICONDUCTORS LIMITED, Plymouth (GB)

(72) Inventor: Samir Mezouari, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 659 days.

(21) Appl. No.: 17/801,935

(22) PCT Filed: Mar. 16, 2021

(86) PCT No.: PCT/EP2021/056711
§ 371 (c)(1),
(2) Date: Aug. 24, 2022

(87) PCT Pub. No.: WO2021/185852
PCT Pub. Date: Sep. 23, 2021

(65) Prior Publication Data
US 2023/0105727 A1    Apr. 6, 2023

(30) Foreign Application Priority Data
Mar. 17, 2020 (GB) .................................... 2003858

(51) Int. Cl.
*H10H 20/855*    (2025.01)
*H10H 20/821*    (2025.01)
(Continued)

(52) U.S. Cl.
CPC ........ *H10H 20/855* (2025.01); *H10H 20/821* (2025.01); *H10H 20/841* (2025.01); *H10H 29/142* (2025.01)

(58) Field of Classification Search
CPC .. H10H 20/855; H10H 29/855; H10H 20/821; H10H 20/841; H10H 29/8421;
(Continued)

(56) References Cited

U.S. PATENT DOCUMENTS 6,091,537 A * 7/2000 Sun ..................... G02B 26/10
                                                    359/619
6,636,547 B2 * 10/2003 Evans ..................... H01S 5/187
                                                    372/50.1
(Continued)

FOREIGN PATENT DOCUMENTS

CN    111599835 A  *  8/2020  ........... H10H 20/855
EP    0101368 A2      2/1984
(Continued)

OTHER PUBLICATIONS

International Search Report and Written Opinion, PCT/EP2021/056711, dated Jun. 18, 2021, 21 pages.
(Continued)

*Primary Examiner* — Mohammed Shamsuzzaman
(74) *Attorney, Agent, or Firm* — Stinson LLP

(57) ABSTRACT

A micro-LED device for improving emission efficiency of LEDs. The micro-LED (100) comprises a mesa substrate (110) including a recess (111); and a semiconductor material (120) provided in the recess, comprising a first surface (121) adjacent the mesa substrate, a second surface (122) opposite the first surface, and a light emission region (126) configured to emit light in response to application of an electrical current. The second surface comprises a convex surface (127). Light emitted by the light emission region incident on the convex surface is transmitted through the convex surface if an angle of incidence to the normal of the convex surface is smaller than a critical angle, and is refracted upon transmission through the convex surface. The light emission region (126) is located proximate the focal plane of the convex surface (127). An area of the light emission region is smaller than a cross-sectional area of the convex surface in a plane parallel to the light emission region.

19 Claims, 17 Drawing Sheets

(51) Int. Cl.
*H10H 20/841* (2025.01)
*H10H 29/14* (2025.01)

(58) Field of Classification Search
CPC .... H10H 29/142; H10H 29/011; H10H 29/14;
H10H 29/30; H10H 29/32; H10H 29/34;
H10H 29/345; H10H 29/352; H10H
29/362; H10H 29/37; H10H 29/39; H10H
29/41; H10H 29/45; H10H 29/49; H10H
29/8517; H10H 29/8552; H10H 29/922;
H10H 29/942; H10H 29/962; H10H
20/857; H10H 29/857; H10H 20/831;
H10H 29/8321; H10H 20/819
See application file for complete search history.

(56) References Cited

U.S. PATENT DOCUMENTS

| | | | |
|---|---|---|---|
| 7,294,863 B2 * | 11/2007 | Lee | H01S 5/18388 |
| | | | 372/24 |
| 7,989,830 B2 | 8/2011 | Streubel et al. | |
| 2008/0283855 A1 * | 11/2008 | Streubel | H10H 20/819 |
| | | | 257/E33.068 |
| 2015/0236201 A1 | 8/2015 | Shepherd | |
| 2019/0148598 A1 * | 5/2019 | Bower | H10H 20/85 |
| | | | 361/783 |
| 2020/0194623 A1 | 6/2020 | Lauermann et al. | |
| 2020/0335667 A1 * | 10/2020 | Deckers | F21S 41/663 |

FOREIGN PATENT DOCUMENTS

| | | | | |
|---|---|---|---|---|
| EP | 1035423 A2 * | 9/2000 | | G02B 3/00 |
| JP | H0385774 A | 4/1991 | | |
| JP | H1048403 A | 2/1998 | | |
| KR | 20240141204 A * | 9/2024 | | H10H 20/857 |

OTHER PUBLICATIONS

J. Heinen, "Preparation and properties of monolithically integrated lenses on InGaAsP/InP light-emitting diodes," Electronics Letters, Sep. 16, 1982, vol. 18, Issue 19, pp. 831-832.

Great Britain Search Report, Application No. GB2003858.4, dated Aug. 6, 2020, 8 pages.

Taiwanese Search Report, Application No. 110109085, dated Oct. 15, 2021, 13 pages.

* cited by examiner

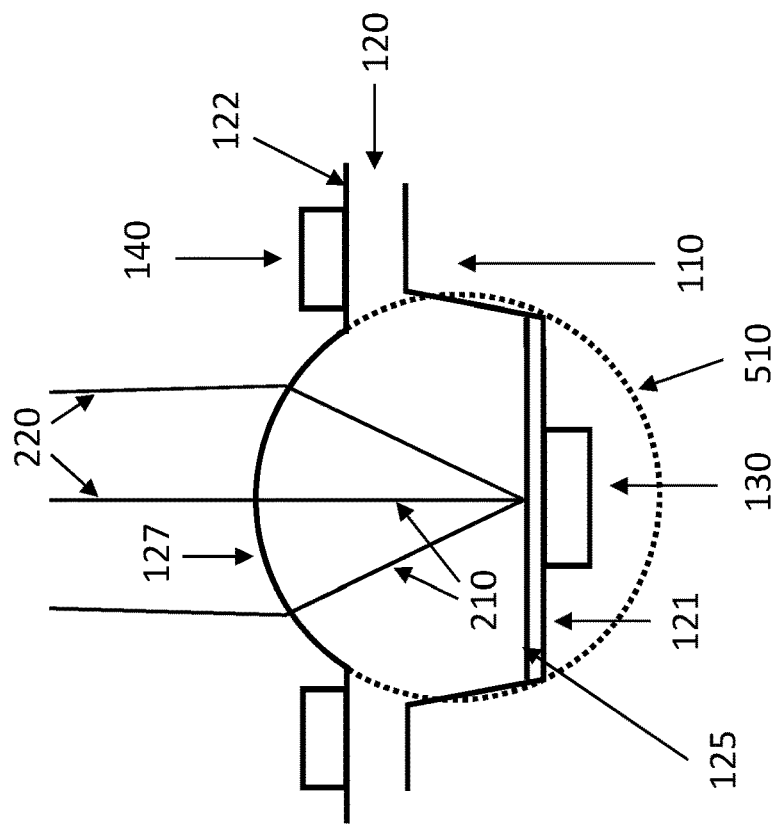
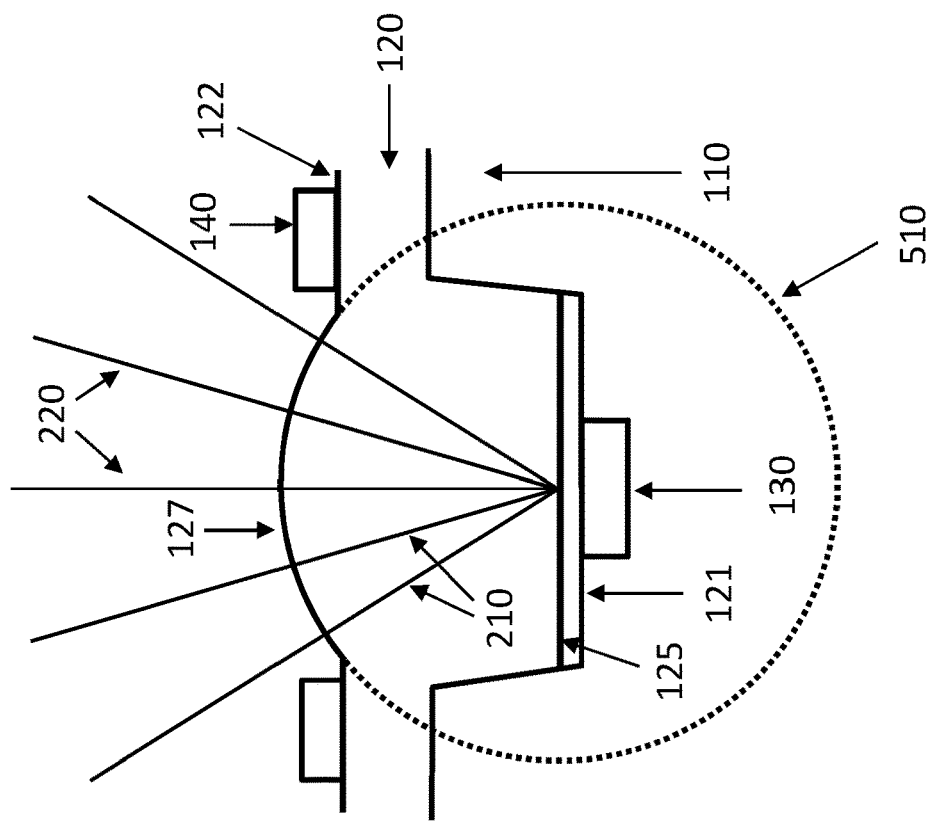
Fig. 5A
Fig. 5B

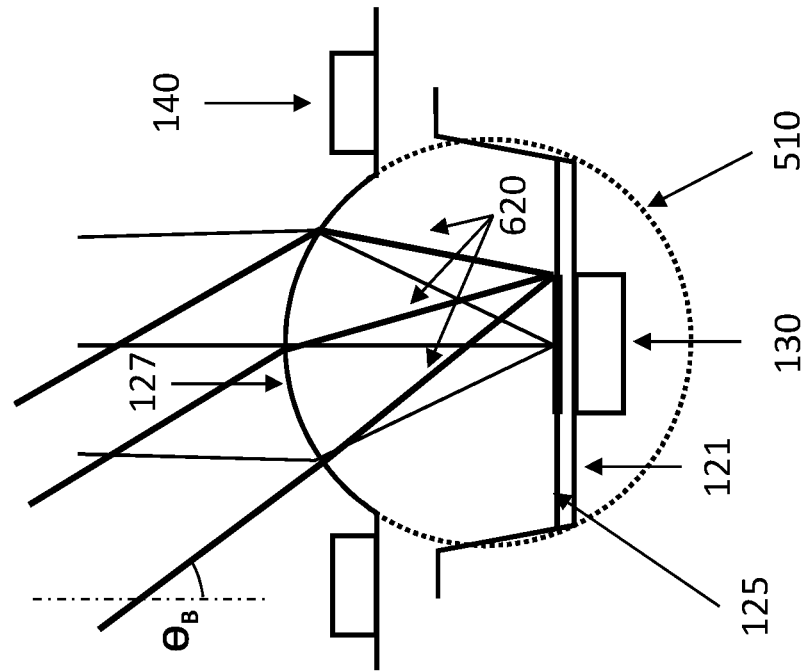
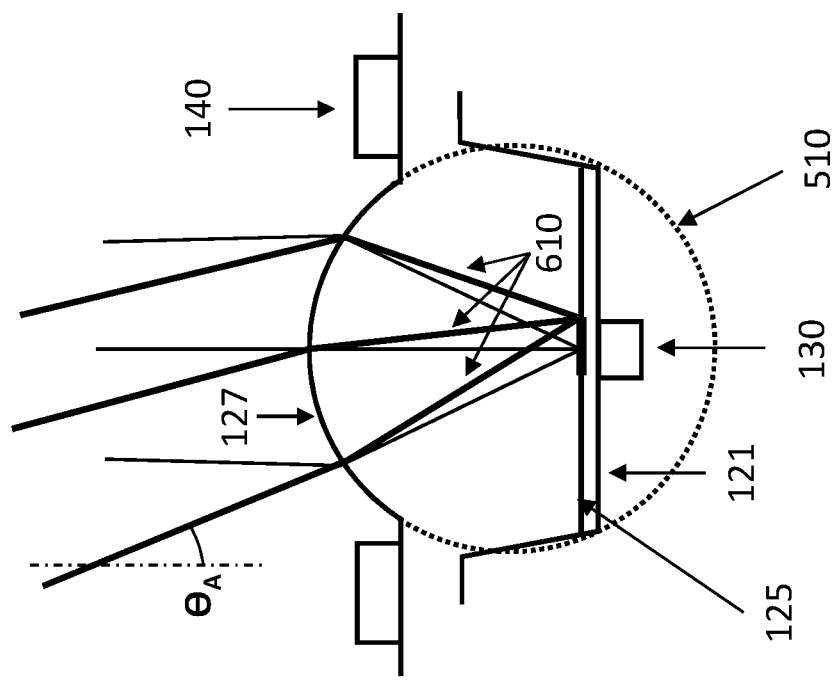
Fig. 6B
Fig. 6A

MICRO-LED DEVICE

REFERENCE TO RELATED APPLICATIONS

This application is the 371 U.S. national stage application of International Patent Application No. PCT/EP2021/056711, filed Mar. 16, 2021, which claims the benefit of Great Britain Patent Application No. 2003858.4, filed Mar. 17, 2020, the entire disclosures of which are incorporated herein by reference.

FIELD OF THE DISCLOSURE

The disclosure relates to the field of light emitting diodes (LEDs). More particularly, the present disclosure relates to methods of improving emission efficiency of LEDs.

BACKGROUND

LEDs convert electrical energy into optical energy. In semiconductor LEDs this usually occurs via electron-hole transitions when recombination of electrons, from an n-doped semiconductor layer, and holes, from a p-doped semiconductor layer, occurs. The active region is the area in which the main light emission takes place. The light generated at a quantum well in an LED is emitted in all directions but the change in refractive index at the boundary of the LED material means that only emitted light rays with an angle of incidence within a critical angle range can be emitted (although some is still lost due to small Fresnel losses with change of angle). If the angle of incidence is outside this escape range, total internal reflection occurs.

Traditional cuboidal LEDs have long path lengths for the emitted rays, since most emitted light is outside the critical angle for escape, so have high absorption. Absorption of light rays as heat can be reduced by reducing path lengths within the device, for example by using micro-LED arrays. This also has the effect that the emitting area is closer to a point source than the large electrodes typically used to maximise light generation. These give a broad source since every point on the surface generates light that is emitted in all directions, so using external optics to converge the emitted light cannot be done effectively. Reducing the dimensions to micro-LEDs improves this by bringing the emitting area closer to a point source, however it also decreases the amount of light emitted and the optical flux. Many micro-LEDs are operating with a current density well below that where the external quantum efficiency is at a maximum value. There is therefore a need to increase optical efficiency and maintain good operating current densities.

Some LEDs emit to air, with the emission efficiency depending on the proportion of photons which escape the LED. The refractive index of the substrate material is generally much higher than that of air, so only light which is close to the normal of the exit surface can escape. Often LEDs are coupled to light collection devices such as projection lenses, in which case there are further losses in capturing the light that has escaped from the LED since the escaped light diverges. Emission efficiency then depends both on the proportion of photons which escape the LED and the proportion of those escaped photons which are captured by the light collection device. The efficiency in capturing the escaped photons depends on size of the divergent light angle (the solid angle formed by the half-power beam width of the emitted light) compared to the light collection angle (the solid angle through which at least half of the available photons are captured by a light collection device). LEDs emit light in an angular distribution close to a Lambertian emission with a full-width half maximum (FWHM) of 120 degrees. The acceptance angle of a lens is determined by its F number, which for a typical projection lens might be F/2.5 or F/3 giving acceptance angles 11.3° and 9.5° respectively. Only 2.7% of light emitted by a Lambertian LED is within ±9.5°, so 97.3% of light is lost. There is clearly a need to increase efficiency of emission from the LED and to collimate the emitted light.

An approach used to enhance emission efficiency is to introduce random nanotexturing on the LED surface, with features on the scale of the wavelength of light leading to chaotic behaviour of light and increased emission efficiency (Applied Physics Letters 63, 1993, pp. 2174-2176). Similarly, periodic or non-periodic patterns on the order of the light wavelength can be introduced to the emitting surface or internal interfaces of LEDs, with interference effects increasing light extraction (U.S. Pat. Nos. 5,779,924 A and 6,831,302 B2). However, roughening results in multiple internal reflections before the light escapes which results in losses.

Achieving collimation usually relies on secondary optical elements, often consisting of a micro-lens array where each micro-lens is aligned with the individual micro-LED to collimate the emitted light (e.g. US2009115970 A1, US2007146655 A1 and US2009050905 A1). These must be precisely aligned with the LED array.

Shaping the sidewalls of LEDs can improve manufacturing and increased light extraction (e.g. U.S. Pat. No. 7,598,149 B2). Etching of the mesa, to form a parabolic mesa structure in which the active layer sits, can also collimate the light emitted (US2015236201 A1 and US2017271557 A1). Light is reflected from the internal surface of the mesa and out of the LED from an emission surface opposed to the mesa. This method risks damaging the active layer, and it is hard to achieve a smooth finish when etching the mesa so there is roughness on the mesa side of the active layer which decreases the degree of collimation that is possible.

It is an object of the present invention to provide a cheaper, simpler way to achieve collimation which does not require alignment of secondary optics or complex and costly manufacture. Etching can be done with conventional photolithography techniques and by etching a convex lens in the LED material, rather than etching the mesa, damage of the active layer can be avoided and the degree of collimation improved.

SUMMARY OF THE DISCLOSURE

Against this background, there is provided:
A micro-LED comprising:
a mesa substrate including a recess;
a semiconductor material provided in the recess, comprising a first surface adjacent the mesa substrate, a second surface opposite the first surface, and a light emission region configured to emit light in response to application of an electrical current;
wherein the second surface comprises a convex surface;
wherein light emitted by the light emission region incident on the convex surface is transmitted through the convex surface if an angle of incidence to the normal of the convex surface is smaller than a critical angle, and is refracted upon transmission through the convex surface;
wherein the light emission region is located proximate the focal plane of the convex surface;

wherein an area of the light emission region is smaller than a cross-sectional area of the convex surface in a plane parallel to the light emission region.

In this way, it is possible to increase overall efficiency of a micro-LED coupled to a light collection device by achieving a narrow collimated light beam due to the refraction of emitted light.

The distance from the light emission region to the focal plane of the convex surface may be less than 35% of the focal length of the convex surface.

The distance from the light emission region to the focal plane of the convex surface may be preferably less than 25%, or more preferably less than 10%.

Advantageously, the light emission region is proximate to the focal plane of the convex surface so that light transmitted through the convex surface is refracted to be close to parallel to the central axis of the lens.

The area of the light emission region may be less than 20% of the cross-sectional area of the convex surface.

The area of the light emission region may be preferably less than 10% of the cross-sectional area of the convex surface, or more preferably less than 5% of the cross-sectional area of the convex surface.

Advantageously, the light emission region is smaller than the cross-sectional area of the convex surface so that light emitted from the edge of the light emission region that is transmitted through the convex surface is refracted to be close to parallel to the central axis of the lens.

The full width half maximum of light emitted by the light emission region that is transmitted through the convex surface may be less than 60 degrees.

The full width half maximum of light emitted by the light emission region that is transmitted through the convex surface may be preferably less than 45 degrees, or more preferably less than 30 degrees, or still more preferably less than 25 degrees.

A narrower light beam emitted from the micro-LED increases the proportion of the light beam that is captured by a light collection device with a given acceptance angle so increases overall efficiency of the micro-LED.

Optionally, a cross-section of the convex surface may be circular.

A radius of curvature of the convex surface may be larger than the cross-sectional radius of a widest part of the convex surface.

Advantageously for ease of fabrication the convex surface should be hemispherical or less than hemispherical.

A central axis of the light emission region may aligned with respect to a central axis of the convex surface.

Advantageously, aligning the light emission region with the central axis of the convex surface results in a more uniform light beam.

Optionally, there may be a reflective metal layer between the mesa substrate and the semiconductor material.

In this way, efficiency is increased as light emitted from the light emission region that is not incident on the convex surface may be reflected from the reflective surface and may subsequently be incident on the convex surface.

The light emission region may be closer to the mesa substrate than to the convex surface.

Advantageously the light emission region is then closer to the focal plane of the convex surface.

A plurality of micro-LEDs may be arranged in an array. The micro-LEDs may be arranged in rows and columns.

In this way, the micro-LEDs may form a high resolution display.

The electrical current may be applied using a first electrode adjacent to the first surface of the semiconductor material and a second electrode adjacent to the second surface of the semiconductor material.

A central axis of the first electrode may be aligned with respect to a central axis of the convex surface.

In this way, the central axis of the light emission region is aligned with respect to a central axis of the convex surface.

The radius of the light-emitting region may be defined by the radius of the first electrode.

Advantageously, the light-emitting region can be small to increase collimation and avoid edge effects.

The area of the first electrode may be less than 20% of the cross-sectional area of the convex surface.

The area of the first electrode may be preferably less than 10% of the cross-sectional area of the convex surface, or more preferably less than 5% of the cross-sectional area of the convex surface.

Advantageously, the electrode and therefore the light emission region is smaller than the cross-sectional area of the convex surface so that light emitted from the edge of the light emission region that is transmitted through the convex surface is refracted to be close to parallel to the central axis of the lens.

BRIEF DESCRIPTION OF THE DRAWINGS

A specific embodiment of the disclosure will now be described, by way of example only, with reference to the accompanying drawings in which:

FIG. 5A shows a schematic cross-section with ray-tracing of a micro-LED with the light emission region at the centre of the convex lens.

FIG. 5B shows a schematic cross-section with ray-tracing of a micro-LED with the light emission region at the focal plane of the convex lens in accordance with an embodiment of the disclosure.

FIG. 6A shows a schematic cross-section with ray-tracing of a micro-LED with the light emission region at the focal plane of the convex lens in accordance with an embodiment of the disclosure.

FIG. 6B shows a schematic cross-section with ray-tracing of a micro-LED with a light emission region with a larger characteristic dimension than that in FIG. 6A at the focal plane of the convex lens.

DETAILED DESCRIPTION

Figure 1:
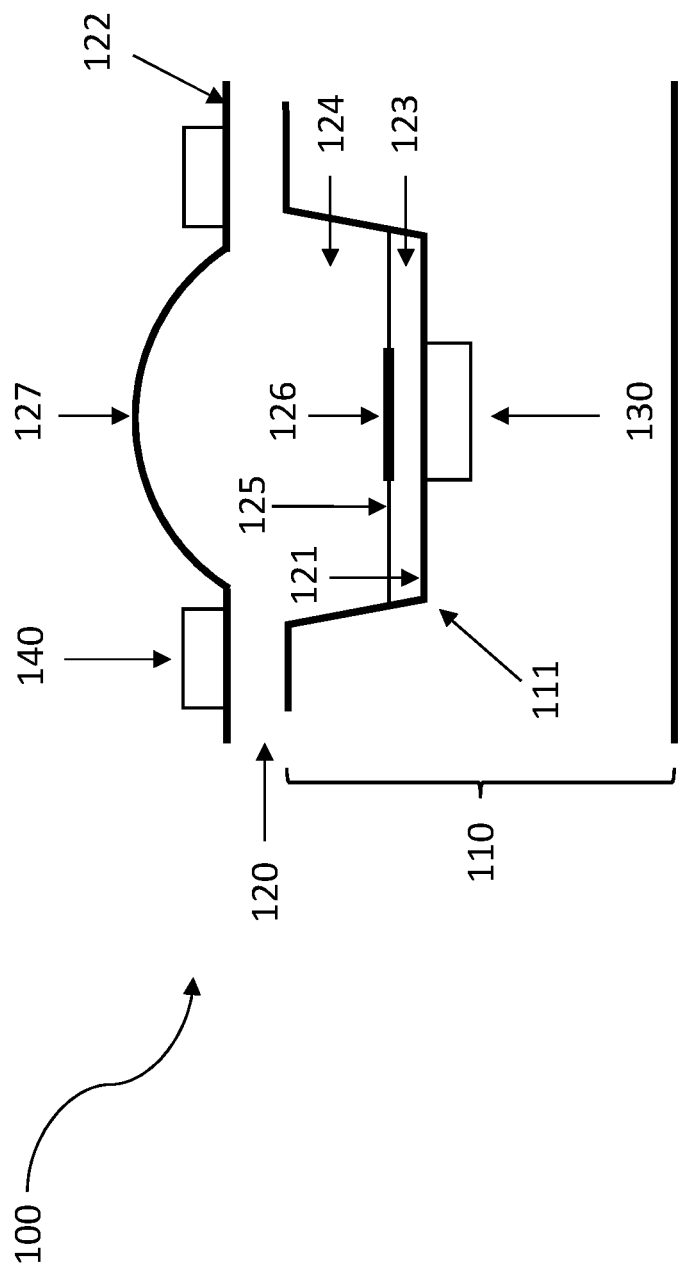
FIG. 1 shows a schematic of a cross-section of a micro-LED in accordance with the disclosure.

According to an embodiment of this disclosure, a micro-LED 100 is provided. With reference to FIG. 1, the micro-LED 100 comprises a mesa substrate 110 which has a recess 111 on a first surface. A semiconductor material 120 is provided on the first surface of the mesa substrate 110. The semiconductor material 120 comprises a first surface 121 adjacent to the mesa substrate 110 and a second surface 122 opposite the first surface 121.

The semiconductor material 120 further comprises a first doped region 123 and a second doped region 124. The interface 125 between the first doped region 123 and the second doped region 124 is configured to emit light when an electrical current is applied. The interface 125 is closer to the first surface 121 than the second surface 122 of the semiconductor material 120. Electrodes 130 and 140 for applying an electrical current are provided on both sides of the semiconductor material 120, exterior to the semiconductor material 120. Electrode 130 is provided on the first surface 121 of the semiconductor material 120, located between the mesa substrate 110 and the semiconductor material 120. The central axis of the electrode 130 is aligned with the central axis of the recess 111 of the mesa substrate 110. Electrode 140 is provided on the second surface 122 of the semiconductor material 120.

When an electrical current is applied to electrodes 130 and 140, the part of the interface 125 that emits light is the part that is proximate to electrode 130 and is given by the light emission region 126. The size and shape of the electrode 130 defines the size and shape of the light emission region 126. The characteristic dimension of the light emission region 126 is therefore defined by the characteristic dimension of the electrode 130. In an embodiment where the electrode 130 is circular, the characteristic dimension may be the diameter of the circular electrode.

The second surface 122 of the semiconductor material 120 comprises a convex surface 127. The central axis of the convex surface 127 may be aligned with the central axis of the recess 111. The central axis of the light emission region 126 may be aligned with the central axis of the convex surface 127, and the characteristic dimension of the light emission region 126 may be smaller than the widest dimension of the convex surface 127.

Figure 2:
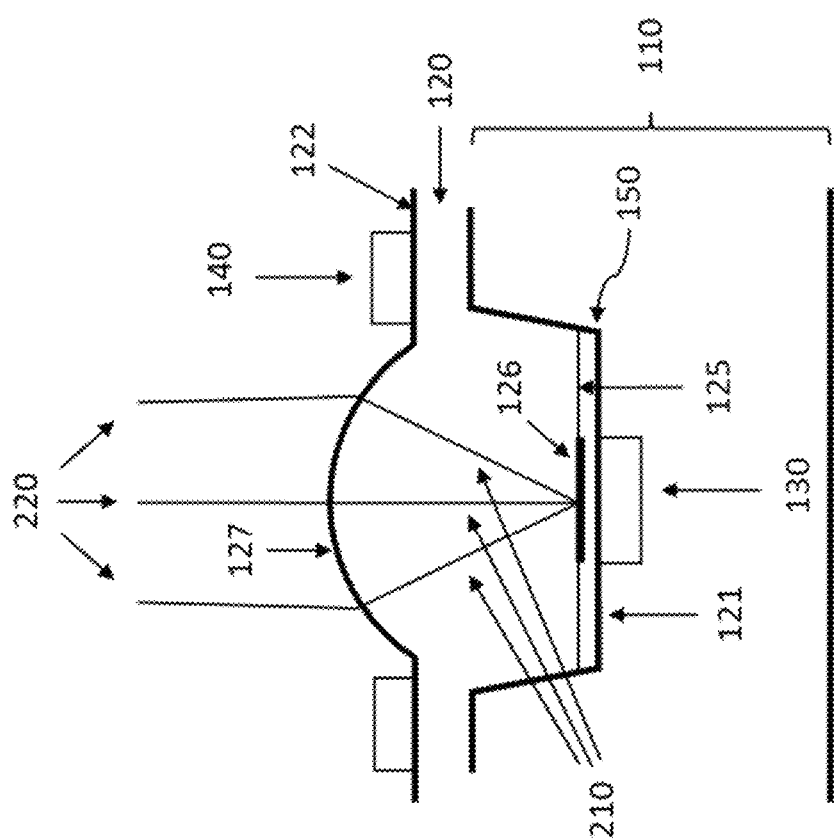
FIG. 2 shows a schematic of a cross-section of a micro-LED with ray-traces of emitted light in accordance with the disclosure.

With reference to FIG. 2, the light emission region 126 is configured to emit light rays 210 when electrical currents are applied to electrodes 130 and 140. Light rays are emitted by the whole of the light emission region 126, but in FIG. 2, for clarity of explanation, only three exemplary light rays 210 are shown which are emitted from a single point only. The exemplary light rays 210 are incident on the convex surface 127 and transmitted as light rays 220. Optionally, there may be a reflective metal layer 150 between the mesa substrate 110 and the semiconductor material 120 as shown in FIG. 2.

Figure 3:
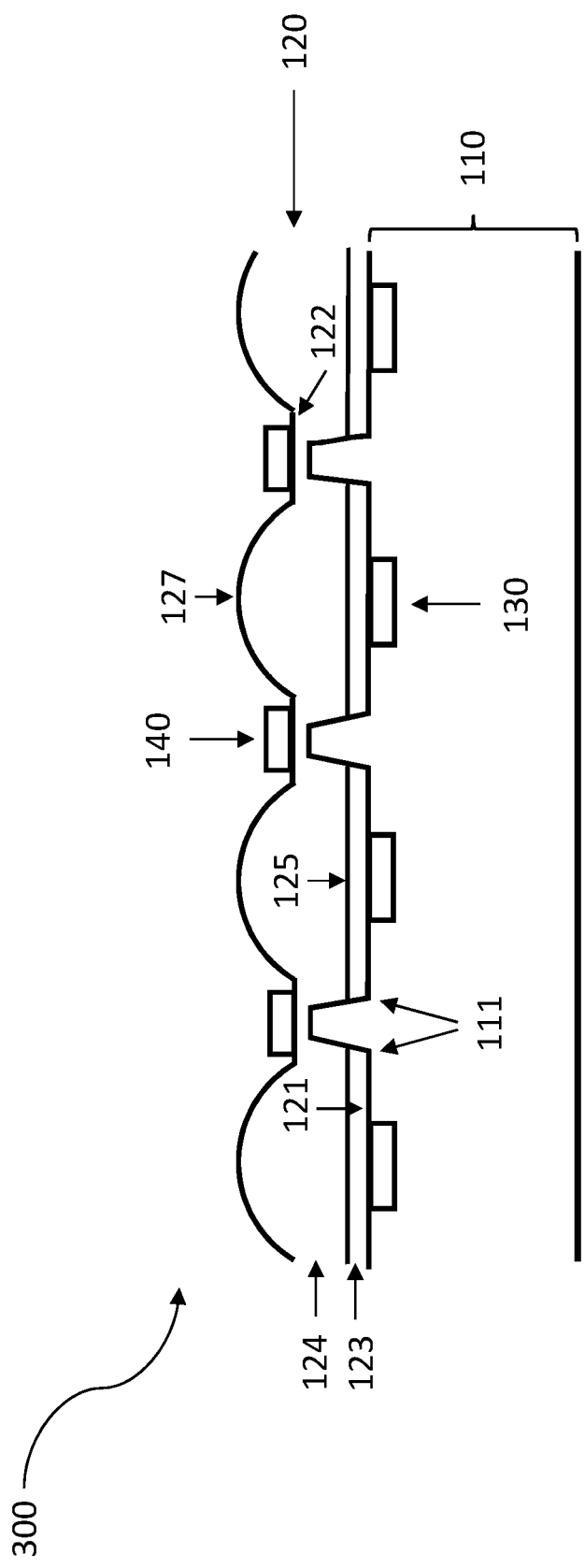
FIG. 3 shows a schematic of a cross-section of an array of micro-LEDs in accordance with an embodiment of the disclosure.

An embodiment of this disclosure may comprise a plurality of micro-LEDs 100 arranged in an array. A schematic of the cross-section of part of an array 300 is shown FIG. 3. In this embodiment, the mesa substrate 110 has a plurality of recesses 111 on a first surface. The semiconductor material 120 is provided on the first surface of the mesa substrate 110. The semiconductor material 120 comprises a first surface 121 adjacent to the mesa substrate 110 and a second surface 122 opposite to the first surface 121. The semiconductor material 120 and structure associated with a single recess 111 comprises a single micro-LED 100.

Within each recess 111, the semiconductor material 120 further comprises a first doped region 123 and a second doped region 124. The interface 125 between the first doped region 123 and the second doped region 124 is configured to emit light when an electrical current is applied. Electrodes 130 and 140 for applying an electrical current are provided on both sides of the semiconductor material 120, exterior to the semiconductor material 120. Electrodes 130 are provided on the first surface 121 of the semiconductor material 120, and are located between the mesa substrate 110 and the semiconductor material 120. The central axis of each electrode 130 may be aligned with the central axis of the corresponding recess 111 in the mesa substrate 110. Electrodes 140 are provided on the second surface 122 of the semiconductor material 120. The electrodes 140 may be equidistant between adjacent recesses 111 in the mesa substrate 110.

The second surface 122 of the semiconductor material 120 comprises a plurality of convex regions, which define a plurality of convex surfaces 127. The central axis of each convex surface 127 may be aligned with the central axis of a recess 111 in the mesa substrate 110.

Figure 4B:
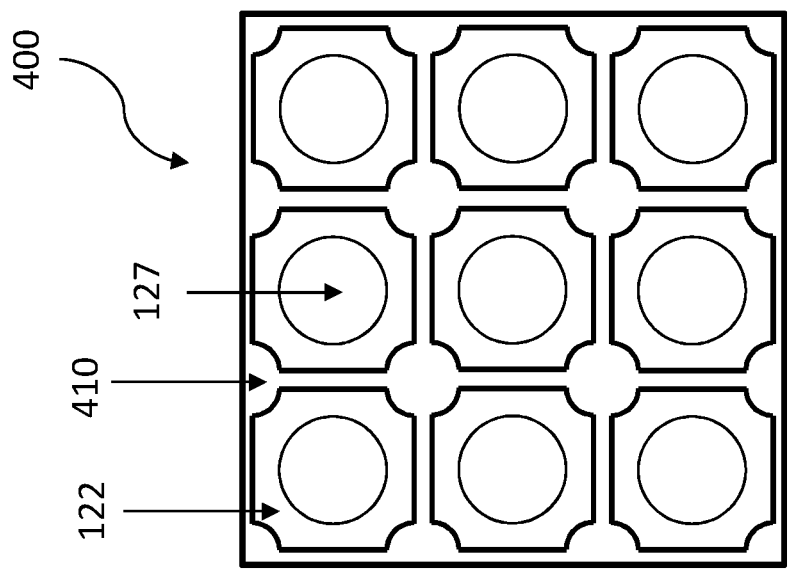
FIG. 4B shows a schematic plan view of an array of micro-LEDs in accordance with an embodiment of the disclosure.
Figure 4A:
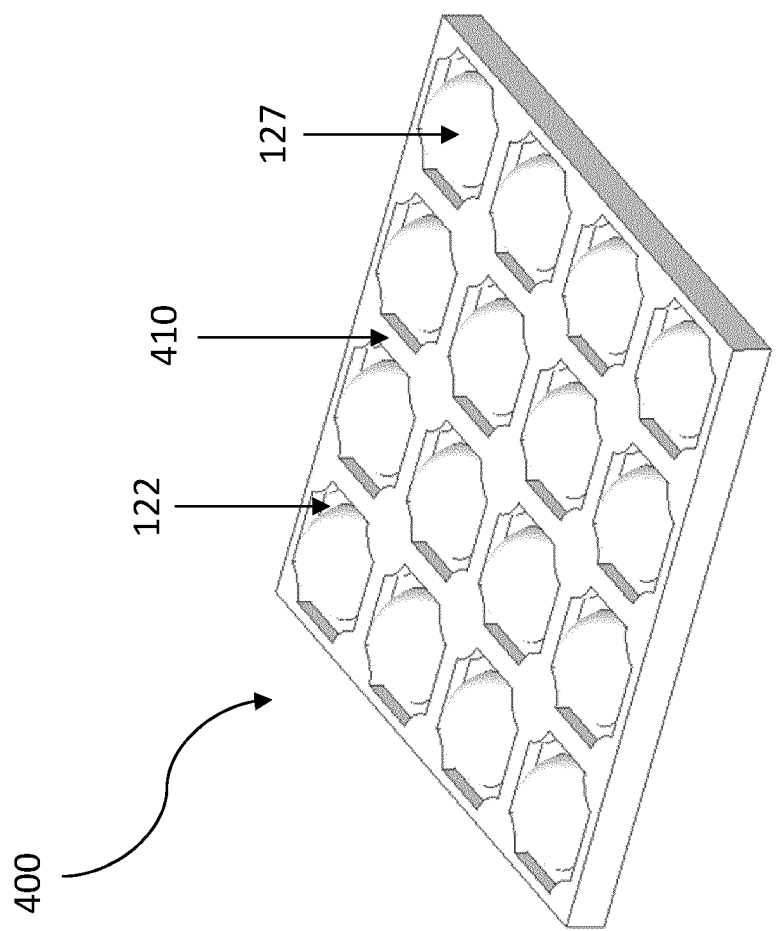
FIG. 4A shows a schematic perspective view of an array of micro-LEDs in accordance with an embodiment of the disclosure.

With reference to FIGS. 4A and 4B, an array 400 comprising a plurality of micro-LEDs 100 is shown. FIG. 4A shows a perspective view and FIG. 4B shows a plan view. Electrode tracks 410 may comprise electrodes 140. The electrode tracks 410 may run equidistant between adjacent micro-LEDs 100, and the convex surfaces 127 are centred between adjacent electrode tracks 410. The electrodes 140 may be provided on the second surface 122 of the semiconductor material 120.

With reference again to FIG. 2, in use, the light emission region 126 emits light when an electrical current is applied using electrodes 130 and 140. Light rays that are incident on the convex surface 127 are transmitted if the angle of incidence to the normal of the convex surface 127 is smaller than a critical angle. Transmitted light rays 220 are shown in FIG. 2. If the angle of incidence of the light ray 210 to the normal of the convex surface 127 is larger than a critical angle, total internal reflection of the light ray 210 occurs (not shown). The proportion of emitted light rays that are transmitted contributes to the extraction efficiency, and is a maximum when the light rays 210 are incident at a normal to the convex surface 127 as this also reduces Fresnel reflections that occur when light rays are refracted.

If the micro-LED 100 is intended to be coupled to a light collection device, only transmitted light rays which are within an acceptance angle of the light collection device will be captured. Any light rays that are outside the acceptance angle of the light collection device will be lost. Collimation of transmitted light is therefore necessary to improve overall efficiency of the micro-LED 100, which can be achieved by refracting transmitted light rays.

The convex surface 127 acts as a lens for light rays 210, such that transmitted light rays 220 are refracted towards the central axis of the lens. The interface 125 is located proximate to the focal plane of the convex surface 127 such that transmitted light rays 220 are refracted to be parallel to each other and to the central axis of the lens. Collimation, and therefore capture efficiency, is maximized.

Both the proportion of emitted light that is transmitted by the convex surface 127 and the extent to which the transmitted light is refracted depend on the angle of incidence of the light rays 210 to the normal of the convex surface 127. The transmission and refraction therefore also depend on the distance between the light emission region 126 and the convex surface 127. With reference to FIGS. 5A and 5B, the cross section of the convex surface 127 forms an arc of a circle 510, shown as a dashed line. The effect of the location of the interface 125 with respect to the radius of curvature of the convex surface 127 is shown in FIGS. 5A and 5B. FIG. 5A shows the configuration that maximizes transmission of emitted light rays 210, whereas FIG. 5B shows the configuration that maximizes collimation of the transmitted light.

FIG. 5A shows the interface 125 intersecting with the centre of the circle 510. The centre of the interface 125 is therefore a distance from the centre of the convex surface 127 equal to the radius of curvature of the convex surface 127. Light rays emitted from the centre of the interface 125 are incident on the convex surface 127 at a normal to the surface so are transmitted without refraction. Emission is maximised since all light rays 210 are transmitted, but there is no collimation of light rays.

FIG. 5B shows an embodiment of the present disclosure. The interface 125 is located proximate to the focal plane of the lens defined by the convex surface 127, such that transmitted light rays 220 are refracted to be parallel or close to parallel to each other. Light rays 220 are refracted such that their angle to the central axis of the lens is zero or minimized and collimation of transmitted light rays 220 is maximised. The optical coupling efficiency is therefore maximized.

As described, the angle of incidence of light rays 210 on the convex surface 127 affects whether the light rays are transmitted and the extent to which the transmitted light rays 220 are refracted. Light emitted from points on the light emission region 126 that are a finite distance from the central axis of the lens defined by the convex surface 127 will therefore undergo different transmission and refraction than light rays that are emitted from the point on the light emission region 126 that is on the central axis of the lens. In particular, if the light emission region 126 is located at the focal plane of the lens, then the point on the light emission region 126 at the central axis of the lens is the focal point of the lens. Light emitted from the focal point of the lens will undergo refraction such that the transmitted light rays 220 are parallel to one another and to the central axis of the lens. Light emitted from a point that is on the focal plane of the lens but is a finite distance from the central axis of the lens will also be refracted, but the transmitted light rays 220 will no longer be parallel to the central axis of the lens. For emission points on the focal plane of the lens, the angle of the transmitted light to the central axis increases as the distance between the emission point and the central axis increases. It is therefore preferable to reduce the size of the light emission region 126 such that the light emitted from the edge of the light emission region 126 is refracted to be at a smaller angle to the central axis of the lens. This is demonstrated in FIGS. 6A and 6B, which shows two schematics of a cross-section of micro-LED 100. The characteristic dimension of light emission region 126 is smaller in FIG. 6A than in FIG. 6B so the light rays 610 emitted from the edge of the light emission region 126 in FIG. 6A are refracted to have a smaller angle to the central axis of the lens than the light rays 620 emitted from the edge of the larger light emission region 126 in FIG. 6B.

Improving the light collection efficiency of a micro-LED 100 is a compromise between maximizing extraction efficiency and the optical coupling efficiency to the light collection device. This is demonstrated by FIGS. 7A to 7E, which shows for a specific embodiment the effect of varying the radius of curvature of the convex surface 127. The results are given for a micro-LED 100 with an overall width of 8 μm, a recess 111 with depth 2.2 μm, a distance of 2.45 μm from the base of the recess 111 to the flat part of the second surface 122 of the semiconductor material 120 and a light emission region 126 with characteristic dimension 2 μm. At its widest part the convex surface 127 has a diameter A of 6.5 μm. Radius of curvature R of the convex surface 127 is varied, and the vertical dimension B of the convex surface 127 is given by $B = R - \sqrt{R^2 - (A/2)^2}$. The graphs are plotted with R/H on the x-axis, where H is the distance between the centre of the convex surface 127 and the light emission region 126 so is given by $(2.45+B)$ μm. The results remain the same if all dimensions are scaled by the same factor.

Figure 7A:
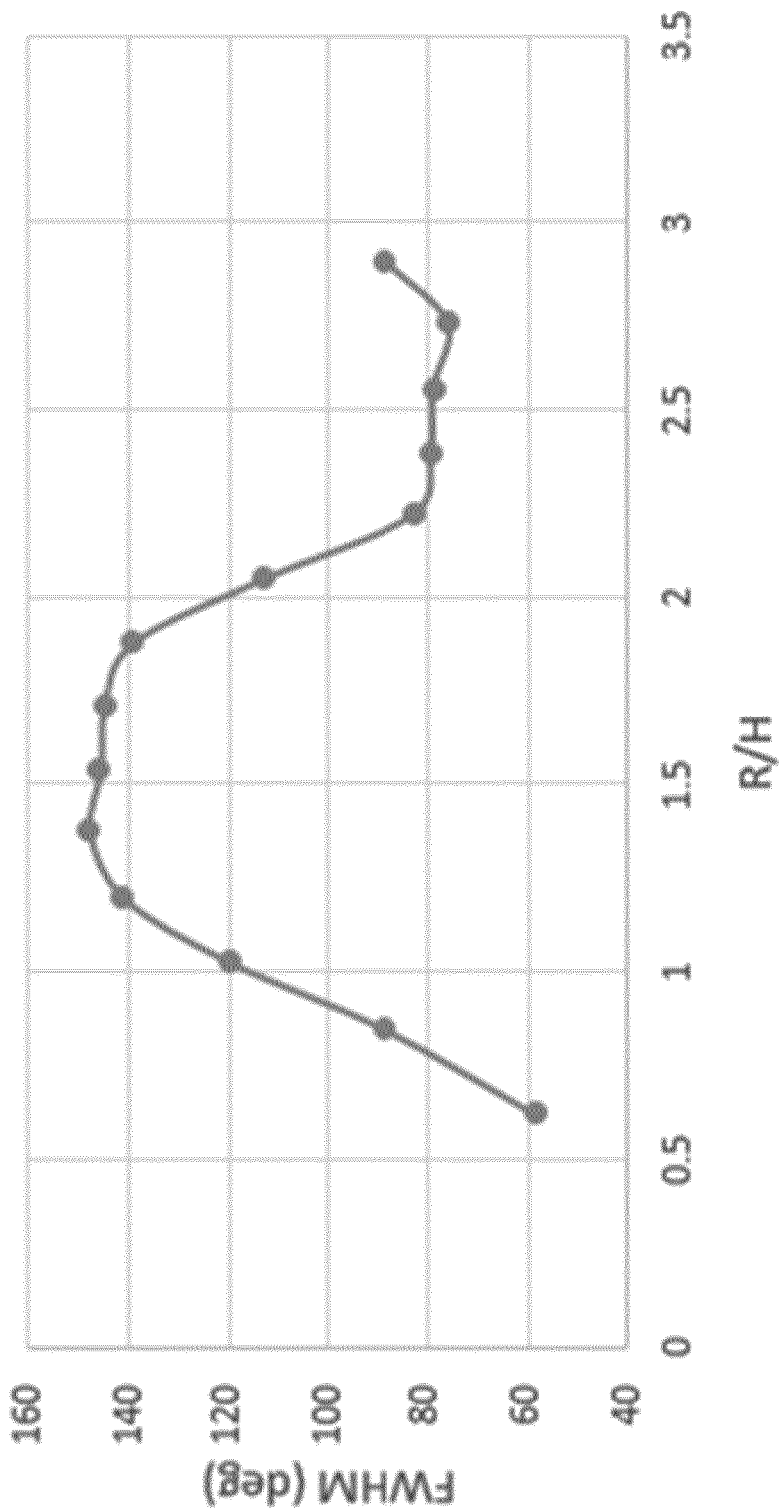
FIG. 7A shows the effects of varying the ratio of radius of curvature to height of the lens on full-width-half-maximum of extracted light for a micro-LED in accordance with an embodiment of the disclosure with a pitch of 8 µm and a light emission region of diameter 2 µm.

FIG. 7A shows variation of the full-width half-maximum (FWHM) of the emitted light beam. The optical coupling efficiency is a maximum for the narrowest emitted light beam and therefore the minimum FWHM. This corresponds to the light emission region 126 being located at the focal plane of the convex surface 127. For a lens in air, the focal distance is given by $$f = \frac{nR}{n-1}$$

where f is the focal distance, R is the radius of curvature of the lens and n is the refractive index of the semiconductor material 120. The results shown in FIG. 7A are for a material of refractive index n=2.44. The graph plots the FWHM against R/H, where H is the distance between the centre of the convex surface 127 and the light emission region 126. The lower bound for R is the value at which the convex surface 127 is a hemisphere, corresponding to R=3.25 μm. The smallest FWHM should occur when H=f, so R/H=0.59. This is seen in the data.

Figure 7B:
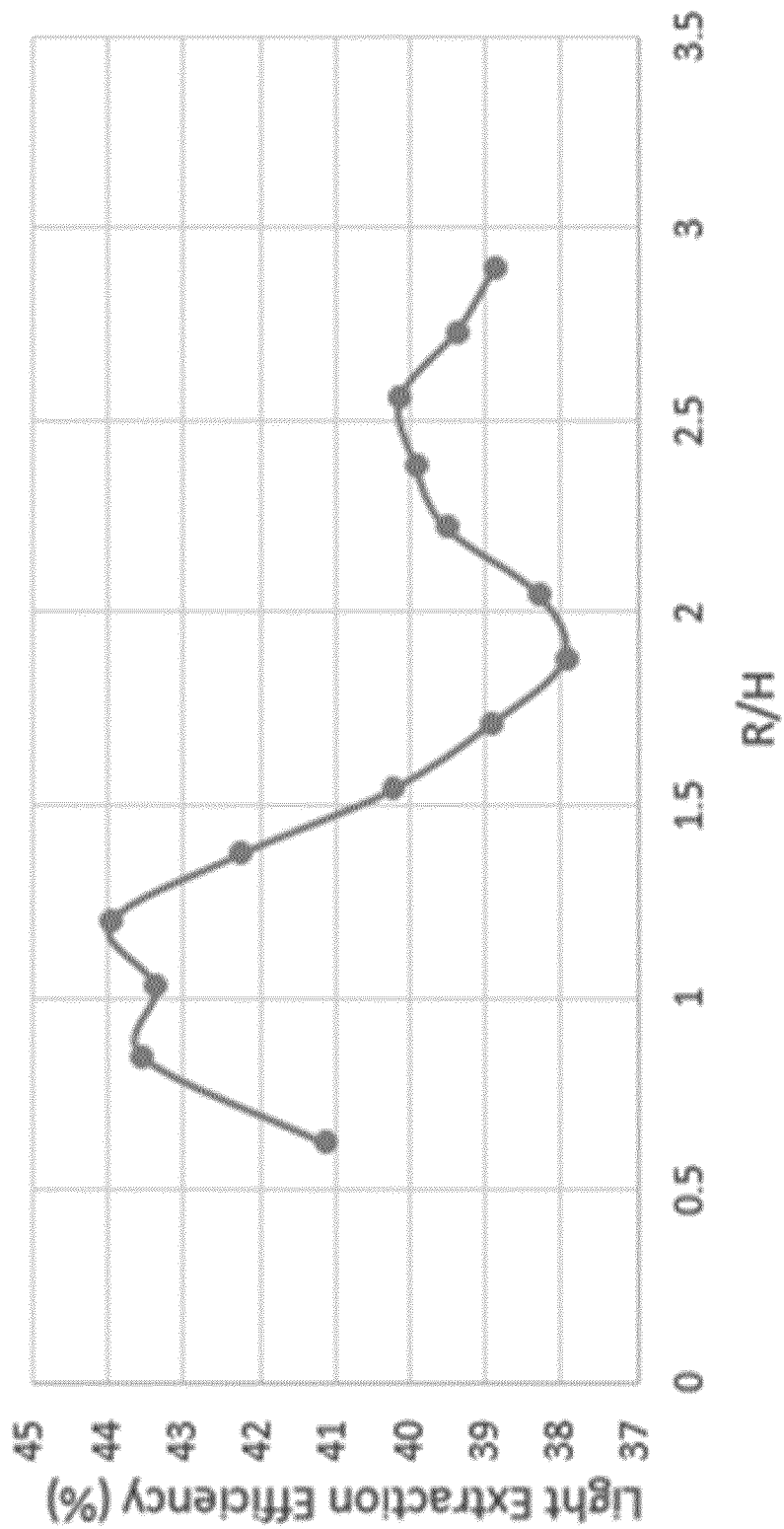
FIG. 7B shows the effects of varying the ratio of radius of curvature to height of the lens on light extraction efficiency for a micro-LED in accordance with an embodiment of the disclosure with a pitch of 8 μm and a light emission region of diameter 2 μm.

FIG. 7B shows the variation of light extraction efficiency, which should be a maximum when the centre of the lens is located at the light emission region 126, as shown in FIG. 5A. This should occur when R/H=1, however there is a local minimum at R/H=1 due to the mesa substrate 110 reflecting some light.

Figure 7C:
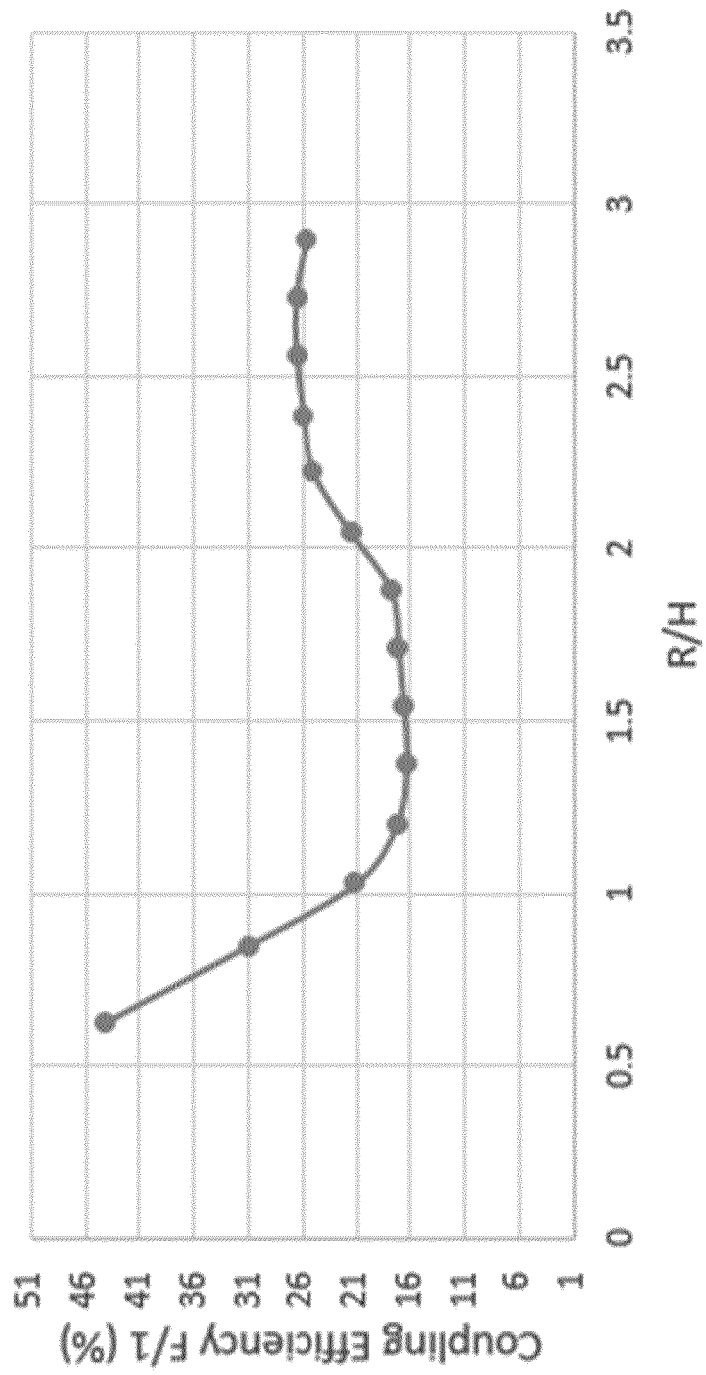
FIG. 7C shows the effects of varying the ratio of radius of curvature to height of the lens on coupling efficiency with a F/1 lens, for a micro-LED in accordance with an embodiment of the disclosure with a pitch of 8 μm and a light emission region of diameter 2 μm.
Figure 7D:
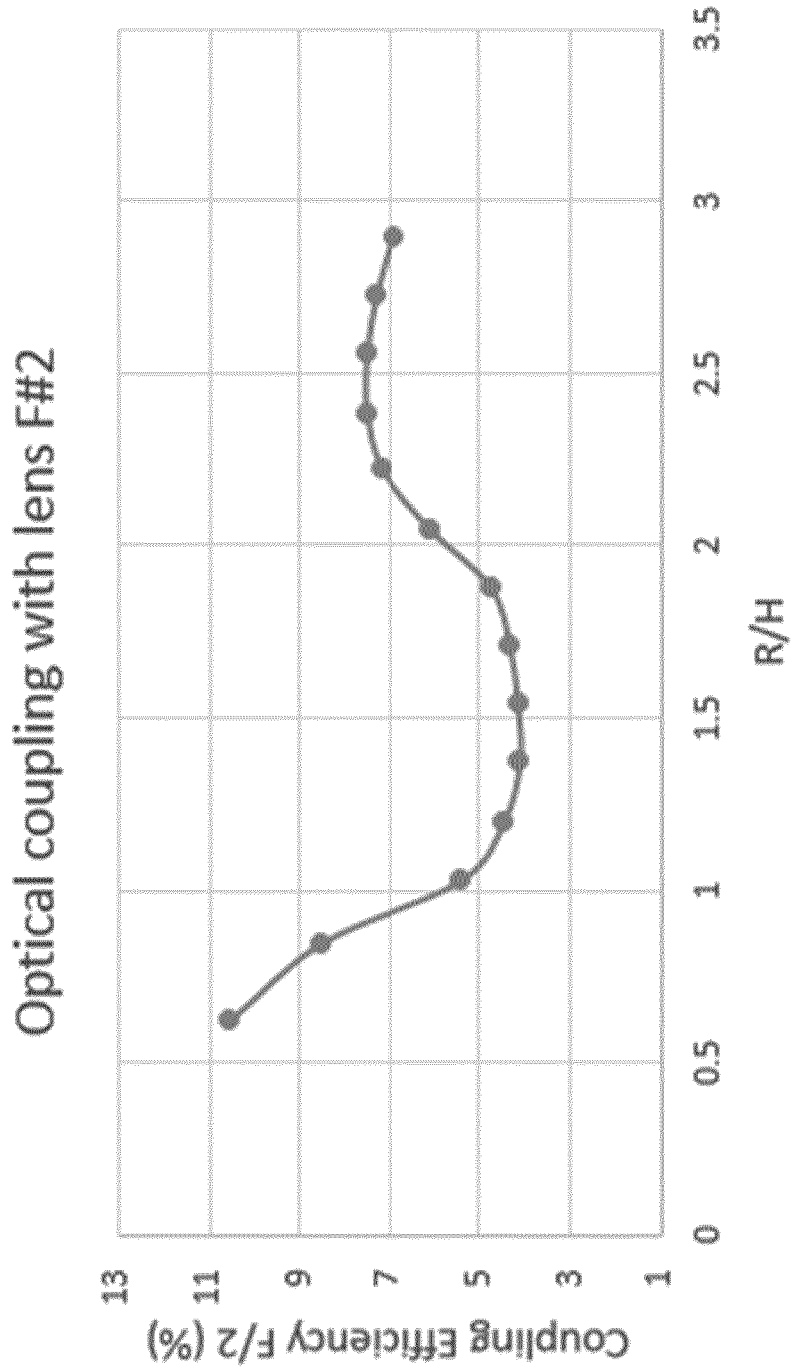
FIG. 7D shows the effects of varying the ratio of radius of curvature to height of the lens on coupling efficiency with a F/2 lens, for a micro-LED in accordance with an embodiment of the disclosure with a pitch of 8 μm and a light emission region of diameter 2 μm.
Figure 7E:
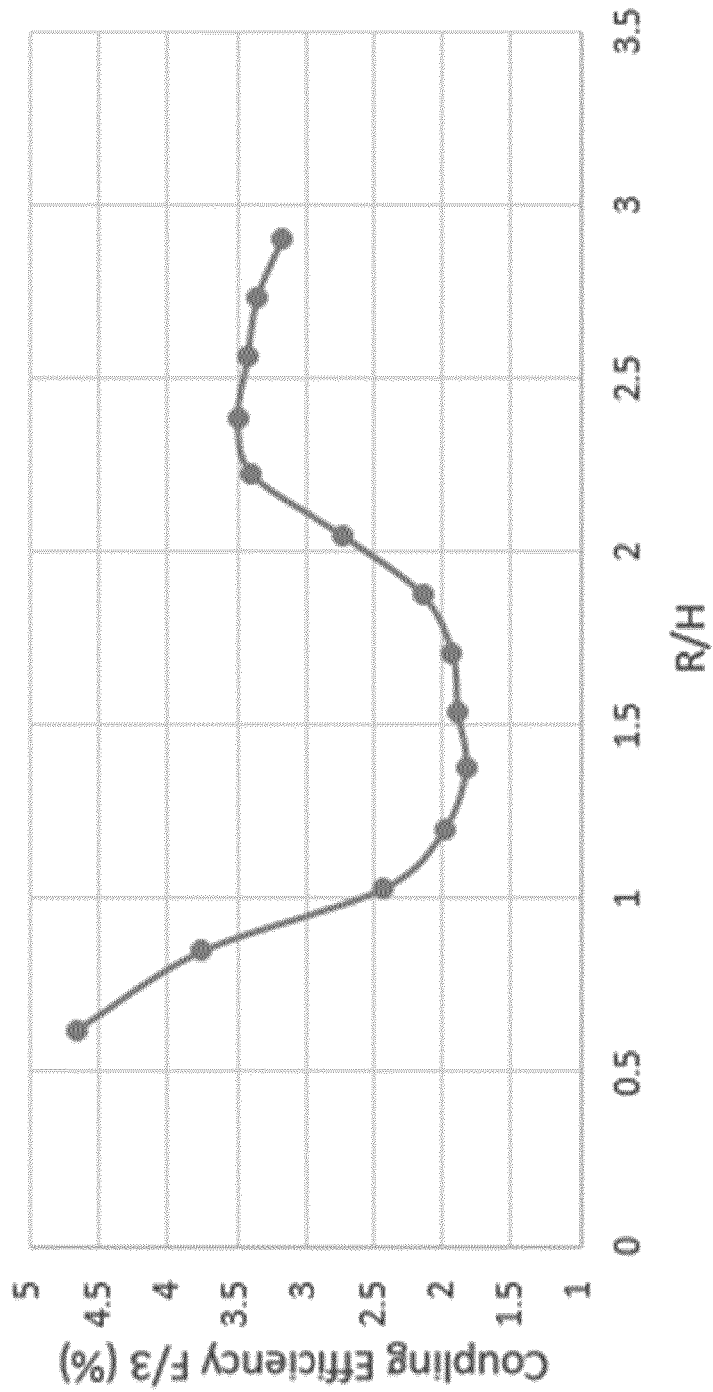
FIG. 7E shows the effects of varying the ratio of radius of curvature to height of the lens on coupling efficiency with a F/3 lens, fora micro-LED in accordance with an embodiment of the disclosure with a pitch of 8 μm and a light emission region of diameter 2 μm.

The overall efficiency of a micro-LED 100 coupled to a light collecting device is a compromise between extraction efficiency (FIG. 7B) and the FWHM of the emitted light beam (FIG. 7A). The overall efficiency is shown in FIGS. 7C-7E for three different light collecting lenses, with different F numbers. The F number is the ratio of the focal length of the lens to its diameter and is a measure of the acceptance angle of the lens, which is given by θ=arctan(1/(2F)). A low F number corresponds to a large acceptance angle and therefore higher coupling efficiency.

The highest overall efficiency for each lens occurs at the same value of R/H as exhibits the minimum FWHM of the extracted light beam. This corresponds to the radius of curvature for which the light emission region 126 lies at the focal plane of the convex surface 127. This value of R/H does not provide the maximum extraction efficiency. Depending upon the intended application, it may therefore be worth sacrificing some extraction efficiency in order to obtain a narrower light beam and maximize overall efficiency; the collimation of the beam is a more important factor in overall efficiency of light capture than the extraction of light from the LED.

FIGS. 8A to 8E also shows the variation of the FWHM, light extraction efficiency and overall efficiency. The plots in FIGS. 8A to 8E show the variation both with radius of curvature and with the characteristic dimension P of the light emission region 126. The size of the light emission region 126 is defined by the size of electrode 130.

Figure 8A:
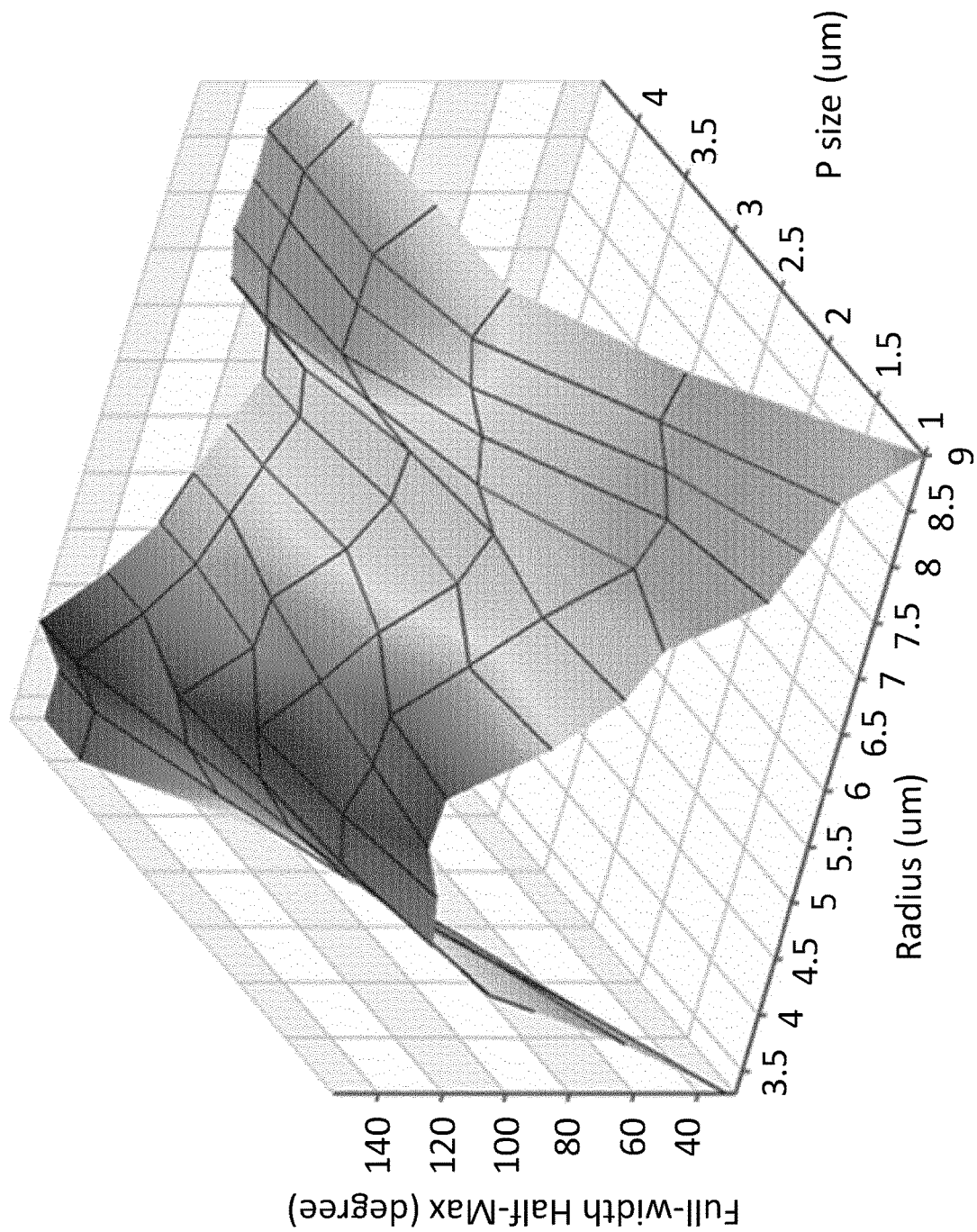
FIG. 8A shows the effects of varying both the radius of curvature of the lens and size of light emission region on full-width-half-maximum of extracted light for a micro-LED in accordance with an embodiment of the disclosure with pitch of 8 μm.

FIG. 8A shows the variation the FWHM of the emitted light beam. The minimum FWHM occurs at the radius R that corresponds to the light emission region 126 being located at the focal plane of the convex surface 127, given by R=3.25 μm. Additionally, the FWHM is reduced by reducing P, the characteristic dimension of the light emission region 126. This is shown schematically in FIGS. 6A and 6B. The graph in FIG. 8A also shows that for any given value of radius of curvature, the FWHM generally reduces as P is reduced. As can be seen from FIG. 8A, the FWHM is low at the expected R=3.25 μm, but is also low for values of R other than that corresponding to the light emission region 126 being located at the focal plane of the convex surface 127. This is due to Fresnel reflections which occur at the convex surface 127 when light is refracted upon transmission through the surface. As a result of the Fresnel reflections, a proportion of a light beam incident on the convex surface 127 (that is incident at an angle to the normal of the surface that is greater than zero but smaller than the critical angle for total internal reflections) is transmitted and refracted and a portion is reflected at the convex surface 127. The reflected portion is incident on the mesa substrate 110 and is reflected from the mesa substrate 110 back towards the convex surface 127, so may eventually be transmitted through the convex surface 127. The extracted light may be collimated with a lower FWHM than if Fresnel reflections had not occurred, however the extraction efficiency is lower and the angular distribution of the beam is less uniform. The result is that despite the FWHM being low, the overall efficiency is lower than for the radius R that corresponds to the light emission region 126 being located at the focal plane of the convex surface 127. For example, for R=9 μm and P=1 μm the FWHM is 26 degrees when Fresnel reflections are taken into account (and 76 degrees when the Fresnel reflections are not considered). However, only 13% of the emitted light is within the FWHM when Fresnel reflections are considered so overall efficiency is very low. For R=3.25 μm and P=1 μm, the light emission region 126 is located at the focal plane of the convex surface 127. In this case, the FWHM is 25 degrees when Fresnel reflections are taken into account and 28% of the emitted light is within the FWHM, so the overall efficiency is higher than for R=9 μm. This will be shown in FIGS. 8C-8E, which show overall efficiency and take into account both FWHM and extraction efficiency.

Figure 8B:
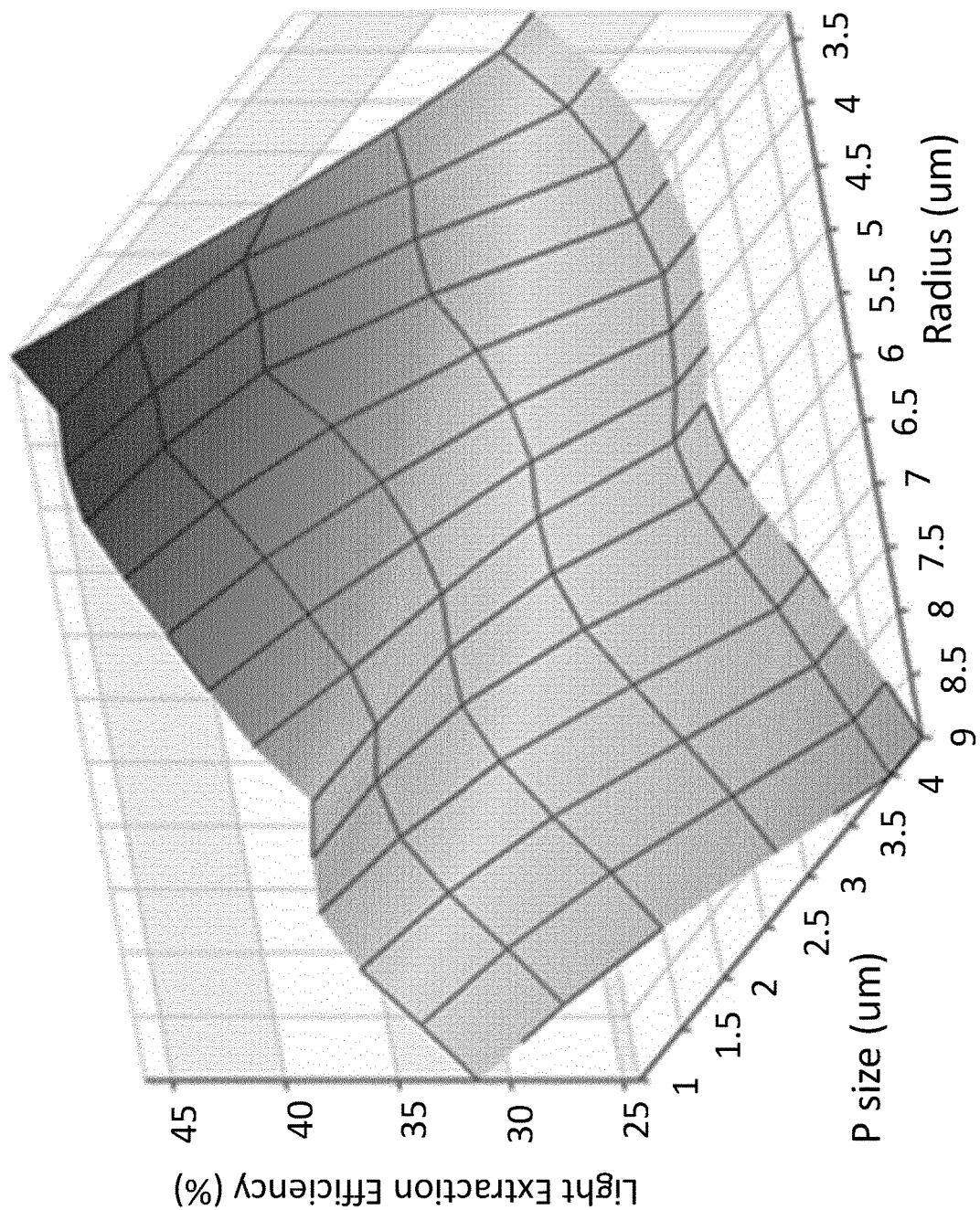
FIG. 8B shows the effects of varying both the radius of curvature of the lens and size of light emission region on light extraction efficiency for a micro-LED in accordance with an embodiment of the disclosure with pitch of 8 μm.

FIG. 8B shows the variation of light extraction efficiency, which should be a maximum when the light emission region 126 is located at the centre of the lens, as shown in FIG. 5A. For the system simulated in FIG. 8B, this should correspond to a radius of curvature of 4.7 μm. There is some variation as to the actual maximum with respect to R due to reflection of light from the mesa substrate 110. FIG. 8B also shows that the light extraction efficiency also generally increases as P is reduced. This may be expected, as light emitted from the point on the light emission region 126 that is on the central axis of the lens will be incident on the convex surface 127 a smaller angle than light emitted from points on the light emission region 126 at a finite distance from the central axis of the lens.

Figure 8C:
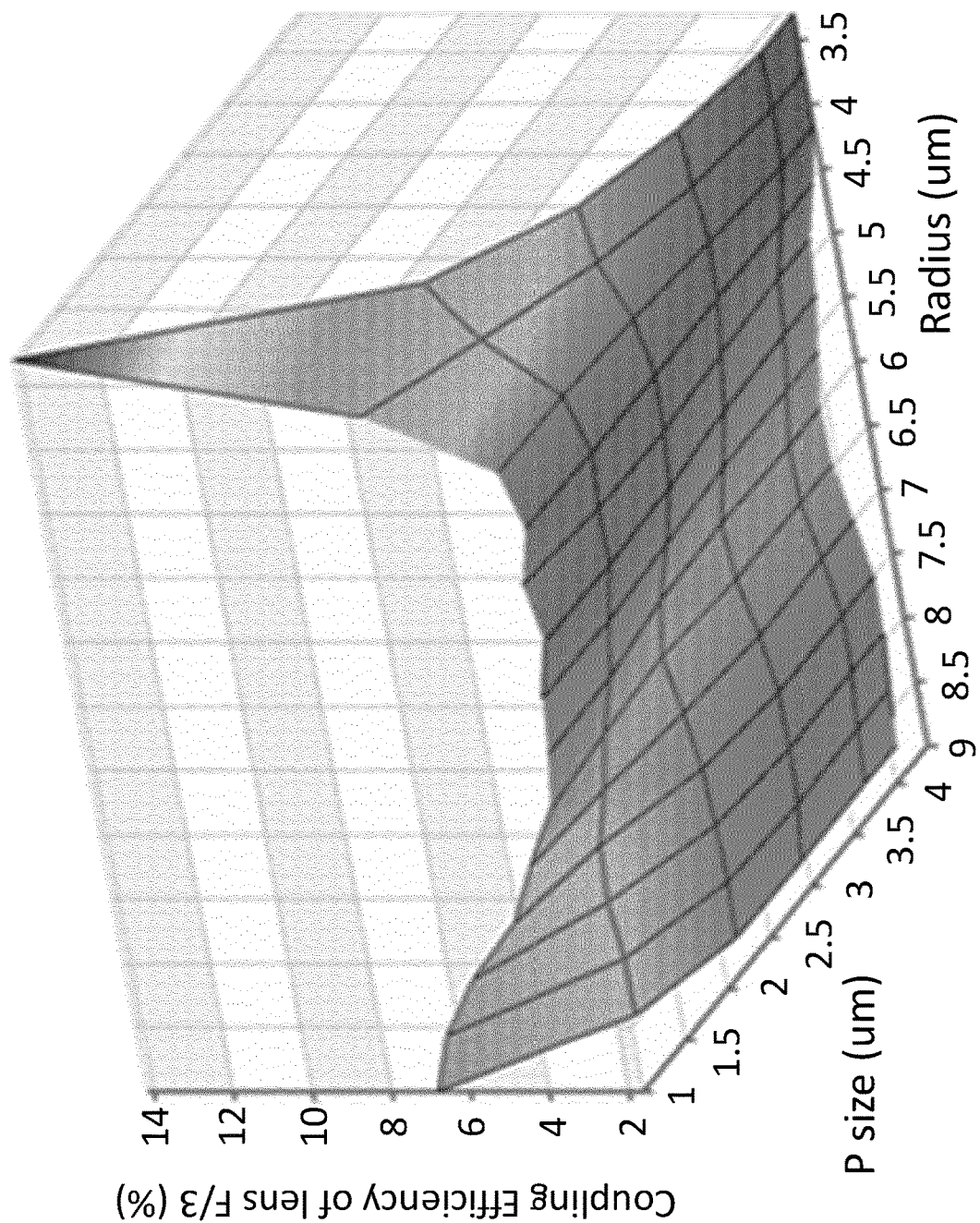
FIG. 8C shows the effects of varying both the radius of curvature of the lens and size of light emission region on coupling efficiency with a F/1 lens, for a micro-LED in accordance with an embodiment of the disclosure with pitch of 8 μm.
Figure 8D:
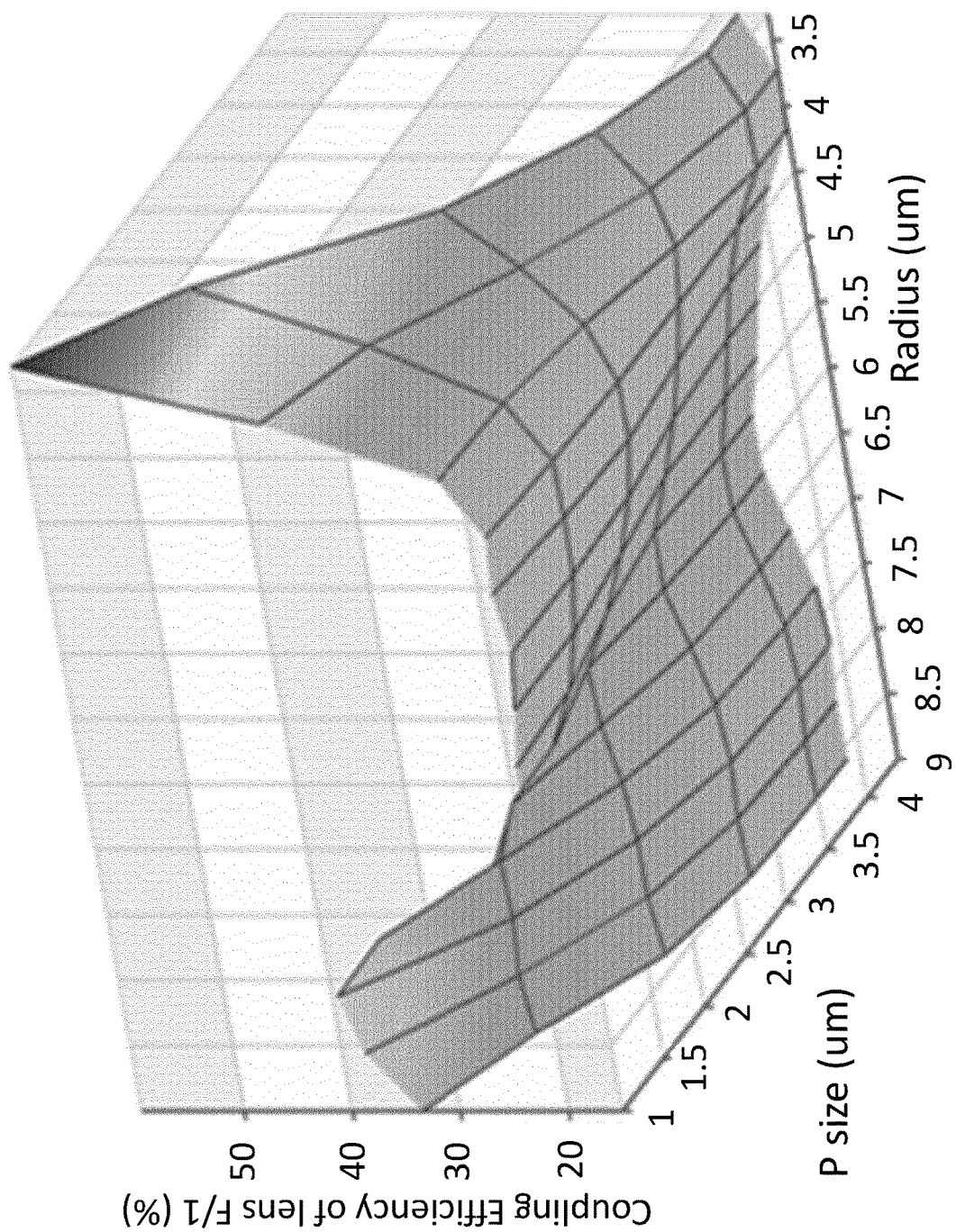
FIG. 8D shows the effects of varying both the radius of curvature of the lens and size of light emission region on coupling efficiency with a F/2 lens, for a micro-LED in accordance with an embodiment of the disclosure with pitch of 8 μm.
Figure 8E:
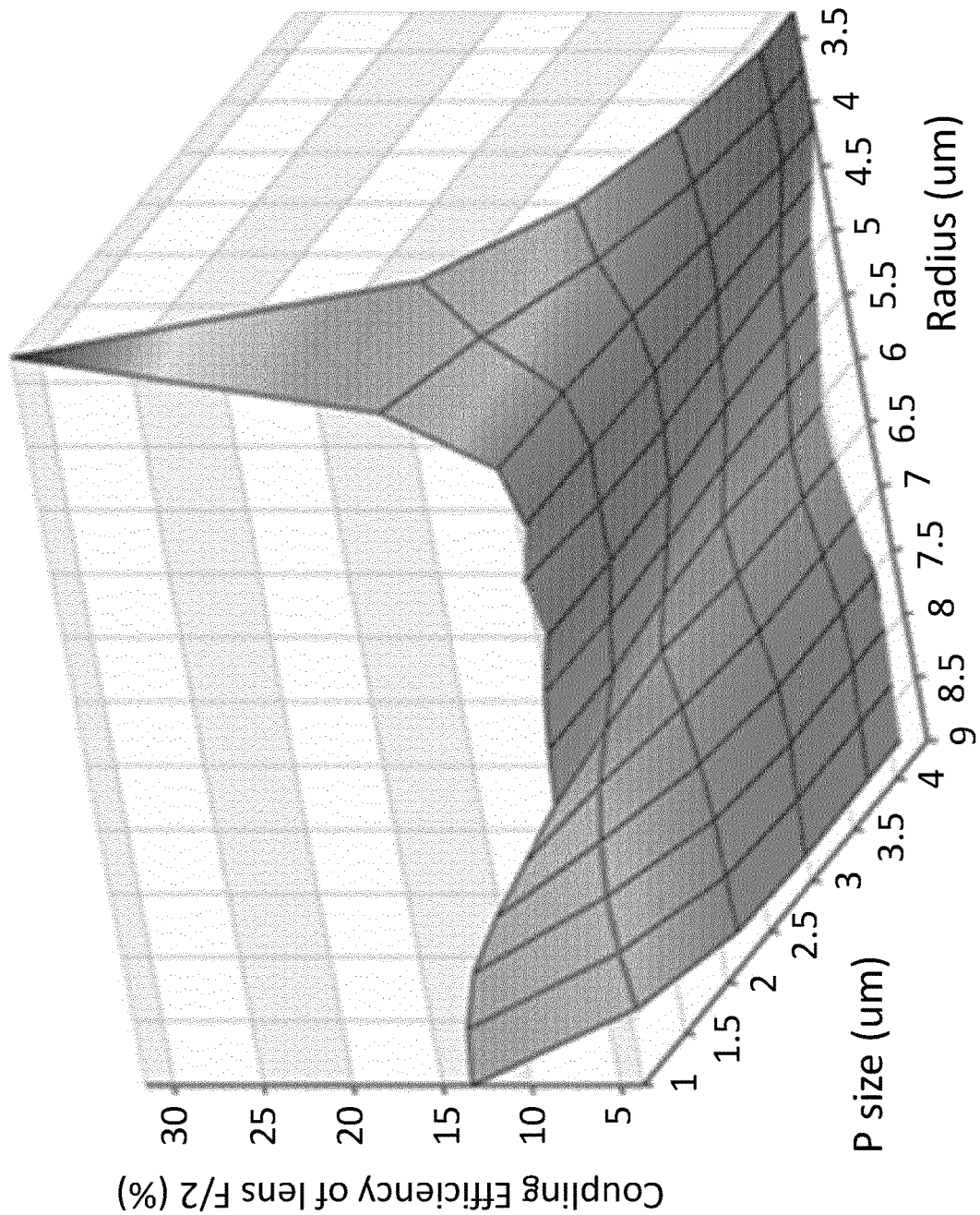
FIG. 8E shows the effects of varying both the radius of curvature of the lens and size of light emission region on coupling efficiency with a F/3 lens, for a micro-LED in accordance with an embodiment of the disclosure with pitch of 8 μm.

FIGS. 8C, 8D and 8E shows the overall efficiency of the LED when coupled to lenses with three different F numbers. As described above, the overall efficiency is a compromise between light extraction efficiency and collimation of the extracted light (measured by the FWHM). FIGS. 8C-8E all show that the maximum efficiency is obtained for a radius of curvature R=3.25 μm that corresponds to the light emission region 126 being located at the focal plane, as shown also in FIGS. 7C-7E. This corresponds to the minimum FWHM but not to the optimal light extraction efficiency. FIGS. 8C-8E all show that the maximum efficiency is obtained with as small a light emission region 126 as possible, which corresponds to the optimum FWHM and the optimum light extraction efficiency. The choice of radius of curvature is a compromise between reducing the FWHM and increasing the light extraction efficiency, whereas a small light emission region 126 may be preferable for both reducing the FWHM and increasing the light extraction efficiency. Therefore, despite the reduction in the number of photons emitted when size of the light emission region 126 is reduced, the improvements in extraction efficiency and in collimation are sufficient that reducing the size of the light emission region 126 results in more photons being captured by the lens. Less electrical power would therefore be needed to capture the same number of photons when coupling a lens to the micro-LED 100 of this disclosure than to a micro-LED 100 without the collimation from the lens and the smaller light emission region 126.

In an embodiment of the disclosure, the distance from the light emission region 126 to the focal plane of the convex surface 127 may be less than 35% of the focal length of the convex surface 127. The distance from the light emission region 126 to the focal plane of the convex surface 127 may be preferably less than 25%, or more preferably less than 10%. In a certain embodiment of the disclosure, the distance from the light emission region 126 to the focal plane of the convex surface 127 is less than 2 µm of the focal length of the convex surface 127. The distance from the light emission region 126 to the focal plane of the convex surface 127 may be preferably less than 1.5 µm, or more preferably less than 0.5 µm.

In an embodiment of the disclosure, the area of the light emission region 126 may be less than 20% of the cross-sectional area of the convex surface 127. The area of the light emission region 126 may be preferably less than 10% of the cross-sectional area of the convex surface 127, or more preferably less than 5% of the cross-sectional area of the convex surface 127. In a certain embodiment of the disclosure, the diameter of the light emission region 126 may be less than 3 µm. The diameter of the light emission region 126 may be preferably less than 2 µm, or more preferably less than 1.5 µm.

In an embodiment of the disclosure, the area of the electrode 130 may be less than 20% of the cross-sectional area of the convex surface 127. The area of the electrode 130 may be preferably less than 10% of the cross-sectional area of the convex surface 127, or more preferably less than 5% of the cross-sectional area of the convex surface 127.

In an embodiment of the disclosure, the full width half maximum of light emitted by the light emission region 126 that is transmitted through the convex surface 127 may be less than 60 degrees. The full width half maximum of light emitted by the light emission region 126 that is transmitted through the convex surface 127 may be preferably less than 45 degrees, or more preferably less than 30 degrees, or still more preferably less than 25 degrees. In a certain embodiment, the full width half maximum of light emitted by the light emission region 126 that is transmitted through the convex surface 127 may be 20 degrees.

The mesa substrate 110 may contain an oxide material such as $SiO_2$. It may have a thin reflective layer such as Aluminium or Silver on its surface, between the mesa substrate 110 and the semiconductor material 120. The semiconductor material 120 may be GaN. The convex surface 127 may be etched.

Figure 9:
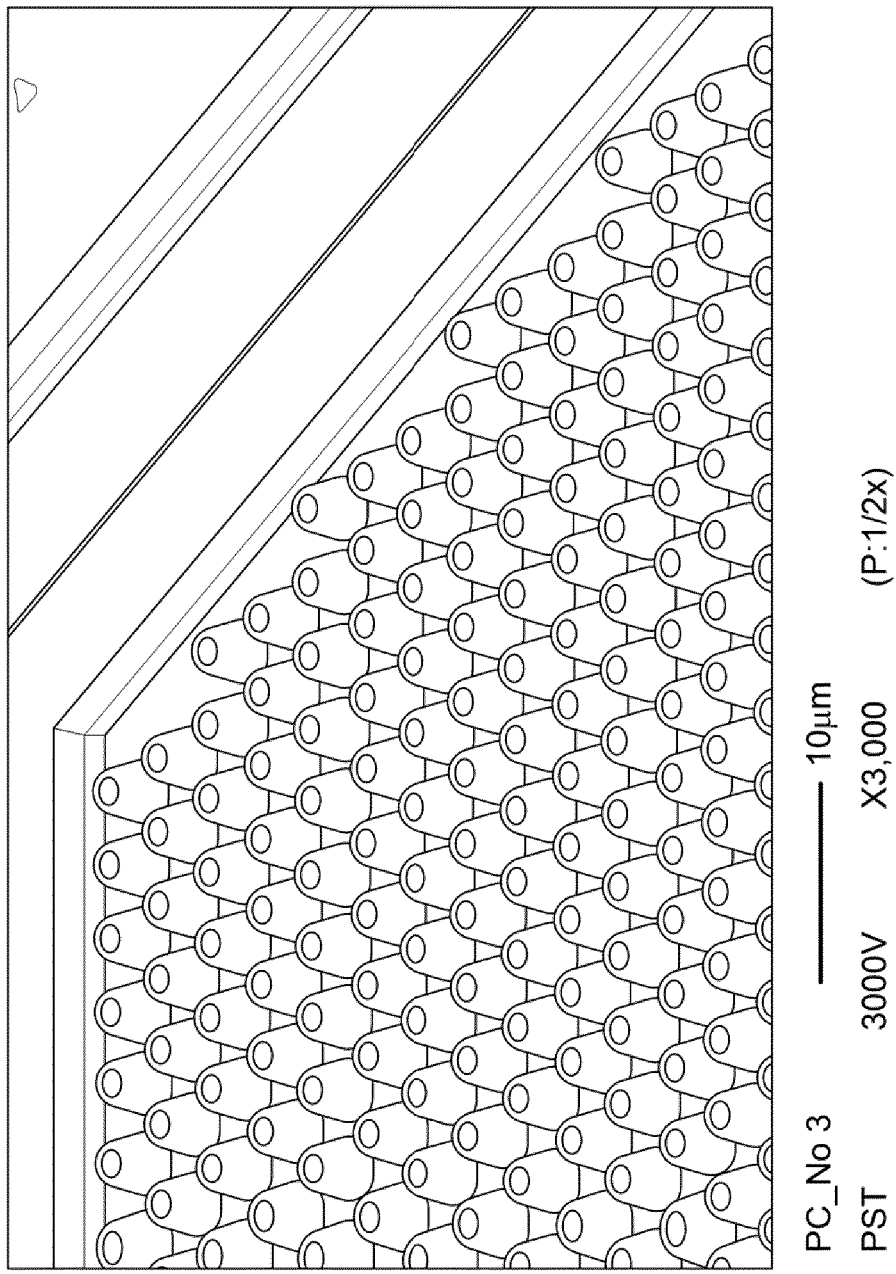
FIG. 9 shows a microscope image of an aspect view of an array of micro-LEDs in accordance with an embodiment of the disclosure.

The manufacturing process may comprise photolithography combined with plasma etching. In a certain embodiment, a 400 nm undoped silicon glass (USG) hard mask and 1780 nm photoresist may be used. A two-step plasma etch may then be used. This may comprise 90 seconds at 720 W using 20% Ar and 30% $Cl_2$ then 140 s at 720 W using 20% Ar and 50% $Cl_2$. The process gives the structures shown in FIG. 9.

The mesa substrate 110 may be shaped by etching which may damage the edge of the mesa substrate 110. This may have a detrimental effect on internal quantum efficiency (and hence external quantum efficiency) of the micro-LED 100. The effect may be limited to the edge of the semiconductor material 120 near to the mesa substrate surface, so the external quantum efficiency may be reduced by edge effects only when the light emission region 126 is close to the mesa substrate 110. A parabolic mesa may be narrow near the light emission region 126 and therefore the light emission region 126 may suffer from edge effects. In this disclosure the mesa substrate 110 is not parabolic in shape and is designed such that the micro-LED 100 does not suffer from mesa etch degradation. The shape of the recess 111 of the mesa substrate 110 may be such that the width at the interface 125 between the first doped region 123 and the second doped region 124 is larger than the light emission region 126 so that a damaged region of the semiconductor material 120 due to etching does not overlap the light emission region 126.

The invention claimed is:

1. A micro-LED comprising:
a mesa substrate including a recess;
a semiconductor material provided in the recess, comprising a first surface adjacent the mesa substrate, a second surface opposite the first surface, and a light emission region configured to emit light in response to application of an electrical current;
wherein the electrical current is applied using a first electrode adjacent to the first surface of the semiconductor material and a second electrode adjacent to the second surface of the semiconductor material and a size of the light emission region is defined by a size of the first electrode;
wherein the second surface comprises a convex surface;
wherein light emitted by the light emission region incident on the convex surface is transmitted through the convex surface if an angle of incidence to the normal of the convex surface is smaller than a critical angle, and is refracted upon transmission through the convex surface;
wherein the light emission region is located proximate the focal plane of the convex surface such that a distance from the light emission region to the focal plane of the convex surface is less than 35% of the focal length of the convex surface; and
wherein an area of the light emission region is smaller than a cross-sectional area of the convex surface in a plane parallel to the light emission region.

2. The micro-LED of claim 1, wherein the distance from the light emission region to the focal plane of the convex surface is less than 25% of the focal length of the convex surface.

3. The micro-LED of claim 1, wherein the area of the light emission region is less than 20% of the cross-sectional area of the convex surface.

4. The micro-LED of claim 3, wherein the area of the light emission region is less than 10% of the cross-sectional area of the convex surface, or less than 5% of the cross-sectional area of the convex surface.

5. The micro-LED of claim 1, wherein the full width half maximum of light emitted by the light emission region that is transmitted through the convex surface is less than 60 degrees.

6. The micro-LED of claim 1, wherein the full width half maximum of light emitted by the light emission region that is transmitted through the convex surface is less than 45 degrees, or less than 30 degrees, or than 25 degrees.

7. The micro-LED of claim 1, wherein a cross-section of the convex surface is circular.

8. The micro-LED of claim 1, wherein a radius of curvature of the convex surface is larger than a cross-sectional radius of a widest part of the convex surface.

9. The micro-LED of claim 1, wherein a central axis of the light emission region is aligned with respect to a central axis of the convex surface.

10. The micro-LED of claim 1, further comprising a reflective metal layer between the mesa substrate and the semiconductor material.

11. The micro-LED of claim 1, wherein the light emission region is closer to the mesa substrate than to the convex surface.

12. The micro-LED of claim 1, wherein a plurality of micro-LEDs are arranged in an array.

13. The micro-LED of claim 12, wherein the micro-LEDs are arranged in rows and columns.

14. The micro-LED of claim 1, wherein a central axis of the first electrode is aligned with respect to a central axis of the convex surface.

15. The micro-LED of claim 14, wherein the radius of the light emission region is defined by the radius of the first electrode.

16. The micro-LED of claim 15, wherein the area of the first electrode is less than 20% of the cross-sectional area of the convex surface, or less than 10% of the cross-sectional area of the convex surface, or less than 5% of the cross-sectional area of the convex surface.

17. The micro-LED of claim 1, wherein a cross-sectional area of the recess is larger than the area of the light emission region.

18. The micro-LED of claim 17, wherein an edge of the light emission region is more than 1 μm from an edge of the recess.

19. The micro-LED of claim 1, wherein the distance from the light emission region to the focal plane of the convex surface is less than 10% of the focal length of the convex surface.

* * * * *